United States Patent [19]

Lonky

[11] Patent Number: 4,611,308
[45] Date of Patent: Sep. 9, 1986

[54] DRAIN TRIGGERED N-CHANNEL NON-VOLATILE MEMORY

[75] Inventor: Martin L. Lonky, Baltimore, Md.

[73] Assignee: Westinghouse Electric Corp., Pittsburgh, Pa.

[21] Appl. No.: 172,726

[22] Filed: Jul. 28, 1980

Related U.S. Application Data

[63] Continuation of Ser. No. 920,298, Jun. 29, 1978, abandoned.

[51] Int. Cl.[4] ............ G11C 11/40; H01L 29/78; H01L 27/02
[52] U.S. Cl. ............... 365/184; 357/23.5; 357/41
[58] Field of Search ............ 357/23, 54, 41, 23 VT; 365/184; 307/238

[56] References Cited

U.S. PATENT DOCUMENTS

| | | | |
|---|---|---|---|
| 3,683,335 | 8/1972 | Cricchi et al. | 357/23 |
| 3,719,866 | 3/1973 | Naber et al. | 357/54 |
| 3,836,894 | 9/1974 | Cricchi | 357/54 |
| 3,877,055 | 4/1975 | Fisher et al. | 357/23 |
| 3,895,360 | 7/1975 | Cricchi et al. | 365/184 |
| 4,019,198 | 4/1977 | Endo et al. | 357/23 |
| 4,063,267 | 12/1977 | Hsia | 357/23 |
| 4,090,258 | 5/1978 | Cricchi | 365/184 |
| 4,138,737 | 2/1979 | McCann | 365/78 |
| 4,193,128 | 3/1980 | Brewer | 365/184 |

OTHER PUBLICATIONS

Iyer "Protective Device for MOS Integrated Circuits" Proc. IEEE vol. 56 (7/68) pp. 1223–1224.

*Primary Examiner*—Gene M. Munson
*Attorney, Agent, or Firm*—W. G. Sutcliff

[57] ABSTRACT

An electrically alterable non-volatile memory for storing information is described incorporating an array of memory elements comprising N-channel variable threshold field effect transistors having at times an N-channel extending from its source to a predetermined distance from its drain, means for writing information into the array and means for reading information from the array.

27 Claims, 9 Drawing Figures

DRAIN TRIGGERED N-CHANNEL NON-VOLATILE MEMORY

This is a continuation of application Ser. No. 920,298, filed June 29, 1978, now abandoned.

BACKGROUND OF THE INVENTION

1. Field of the Invention

This invention relates to semiconductor memories, particularly to non-volatile memories using variable threshold transistors.

2. Description of the Prior Art

In the prior art, non-volatile memories have been fabricated using P-channel variable threshold transistors. The P-channel variable threshold transistor has a large hysteresis window in the enhancement mode region and a small window in the depletion mode region. To avoid memory sensing problems, the P-channel variable threshold transistors are operated or written utilizing the available hysteresis window in the enhancement mode region such as from −2 volts to −10 volts. A desirable structure to insure that the variable threshold P-channel transistor operates in the enhancement mode region is described in U.S. Pat. No. 3,836,894, issued on Sept. 17, 1974 to James R. Cricchi, entitled MNOS/SOS Random Access Memory and assigned to the assignee herein. The patent to Cricchi describes a drain source protected P-channel transistor wherein a thick insulation layer next to the source and drain diffusions keep the transistor exhibiting a threshold voltage of −2 volts or thereabouts while a thin insulation layer between the source thick insulation regions and between the drain provides variable threshold characteristics. The memory transistor when read exhibits enhancement mode characteristics by reason of the thick insulation layer adjacent the drain and source diffusions. From a circuit standpoint, the transistor never goes into the depletion mode such as a $V_{GS}$ of +1 volt but remains in the enhancement mode having a voltage such as −2 volts for one memory state. In the other memory state the transistor may exhibit a threshold voltage of −11 volts, for example.

For high speed non-volatile memories, N-channel technology is desirable because N-channel transistors are inherently faster than P-channel transistors. In N-channel transistors the majority carrier is electrons while in P-channel transistors the majority carrier are holes having a lower mobility constant.

A non-volatile memory utilizing N-channel variable threshold transistors has a small voltage window in the enhancement mode region such as from 4 volts to 1 volt as compared to the P-channel variable threshold transistor which has a large voltage window from −2 volts to −11 volts. However, while the voltage window in the depletion mode in a P-channel variable threshold transistor is from 2 volts to 0 volts, the voltage window in the depletion mode in an N-channel variable threshold transistor is from 1 volt to −10 volts with a window of 11 volts.

It is therefore desirable to provide an N-channel non-volatile memory which utilizes N-channel transistors operating in the depletion region.

It is further desirable to provide a convenient way to read the memory state of a depletion mode N-channel variable threshold device.

It is desirable to provide an N-channel transistor structure which exhibits a variable threshold characteristic in the substrate extending from the source to a predetermined distance from the drain.

It is desirable to provide an N-channel variable threshold transistor memory which does not require the full value of its hysteresis window or variable threshold voltage swing for sensing the information stored in the transistor.

It is further desirable to provide an N-channel variable threshold transistor memory which may have its information read without causing a read-disturb effect to individual transistors.

SUMMARY OF THE INVENTION

In accordance with the present invention, an electrically alterable non-volatile memory is provided for storing information comprising an array of electrically alterable non-volatile memory elements, means for writing information into the array, means for reading information from the array, at least one of the non-volatile memory elements including a P-doped semiconductor substrate having first and second N-doped regions spaced apart, an insulation layer over the substrate overlaying a path from the first N-doped region to the second N-doped region, a conductive layer on top of the insulation layer overlaying a path from the first N-doped region to at least a predetermined distance from the second N-doped region, the insulation layer between the substrate and the conductive layer having a thickness to exhibit a variable threshold characteristic upon application of a polarization voltage to cause at selected times a depletion mode channel to form in the substrate extending from the first N-doped region to a predetermined distance from the second N-doped region to enable conduction between the first and second N-doped regions at times when the depletion mode channel in the substrate intersects with a depletion region extending from the second N-doped region caused by a predetermined potential of the second N-doped region.

The invention further provides an electrically alterable non-volatile memory element for storing information comprising a P-doped semiconductor substrate having first and second N-doped regions spaced apart, an insulation layer over the substrate overlaying a path from the first N-doped region to the second N-doped region, a conductive layer on top of said insulation layer overlaying a path from the first N-doped region to at least a predetermined distance from the second N-doped region, the insulation layer between the substrate and the conductive layer having a thickness to exhibit a variable threshold characteristic upon application of a polarization voltage to cause at selected times a depletion mode channel to form in the substrate extending from the first N-doped region to a predetermined distance from the second N-doped region to enable conduction between the first and second N-doped regions at times when the depletion mode channel in the substrate intersects with a depletion region extending from said second N-doped region caused by a predetermined potential of said second N-doped region.

DESCRIPTION OF THE PREFERRED EMBODIMENTS

Figure 1:
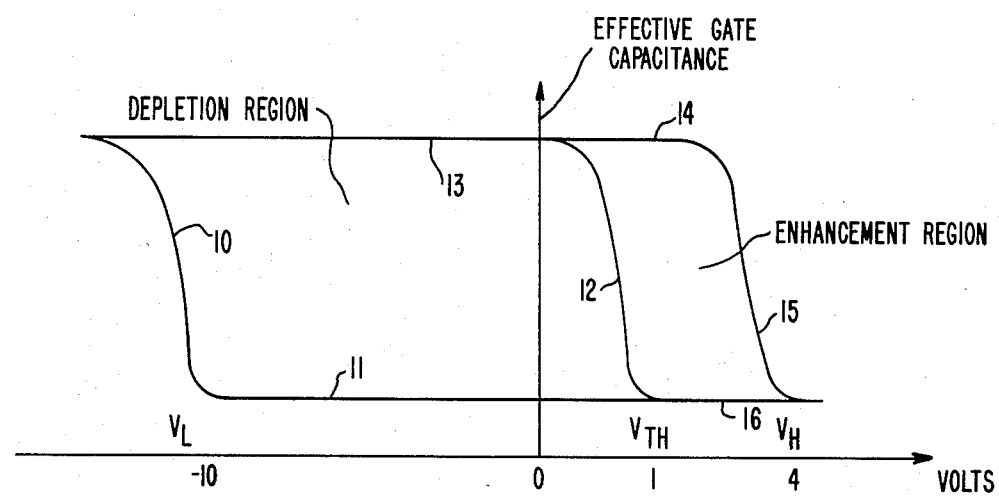
FIG. 1 shows a hysteresis curve of a typical N-channel variable threshold transistor.

Referring now to the drawings, FIG. 1 shows a hysteresis curve of a typical N-channel variable threshold transistor. In FIG. 1 the ordinate represents effective gate capacitance and the abscissa represents volts. The enhancement region is the area within curves 14, 12, 16 and 15. The window or variation in threshold voltage in the enhancement region is from a $V_H$ of +4 volts to a $V_{THRESHOLD}$ of 1 volt or a window of 3 volts. The depletion region is bounded by curves 10, 11, 12 and 13 having a low threshold voltage $V_L$ of −10 volts and an upper threshold voltage of +1 volt or a voltage window of 11 volts. In the depletion region of operation for the transistor enough positive charge has been entrapped by the insulation layer to attract electrons in the substrate near the insulation layer which causes the upper substrate surface to have a greater number of electrons than holes causing an N-channel to form in the substrate.

Figure 2A:
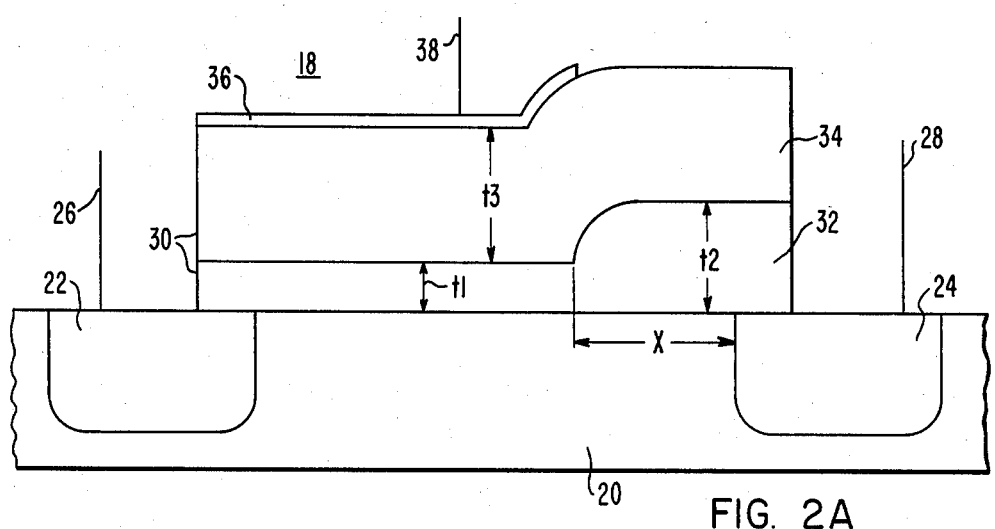
FIGS. 2A and 2B show the structures of an N-channel variable threshold transistor that may be utilized in FIGS. 5 and 6.
Figure 2B:
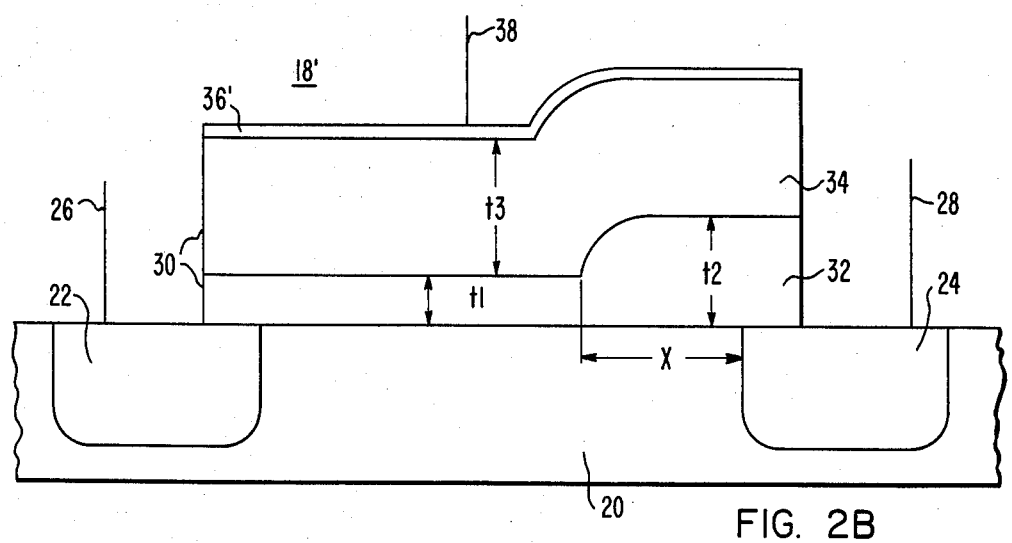
Figure 5:
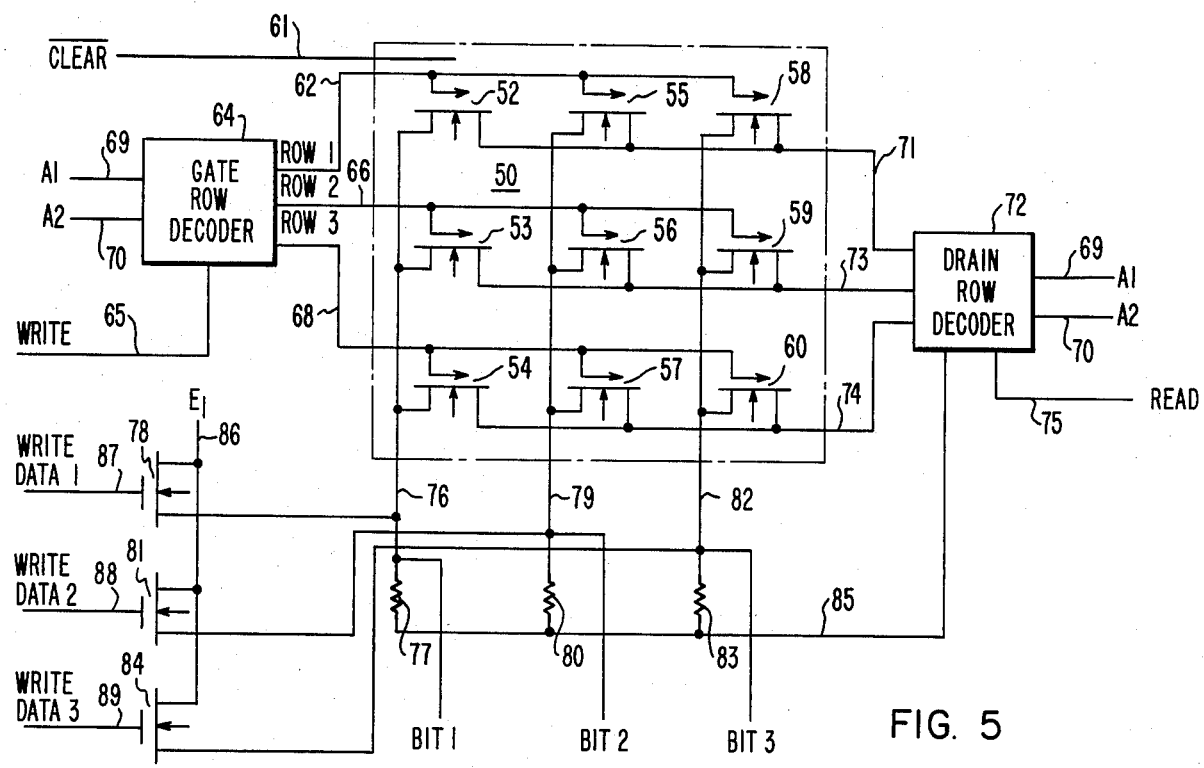
FIG. 5 shows one embodiment of the invention.
Figure 6:
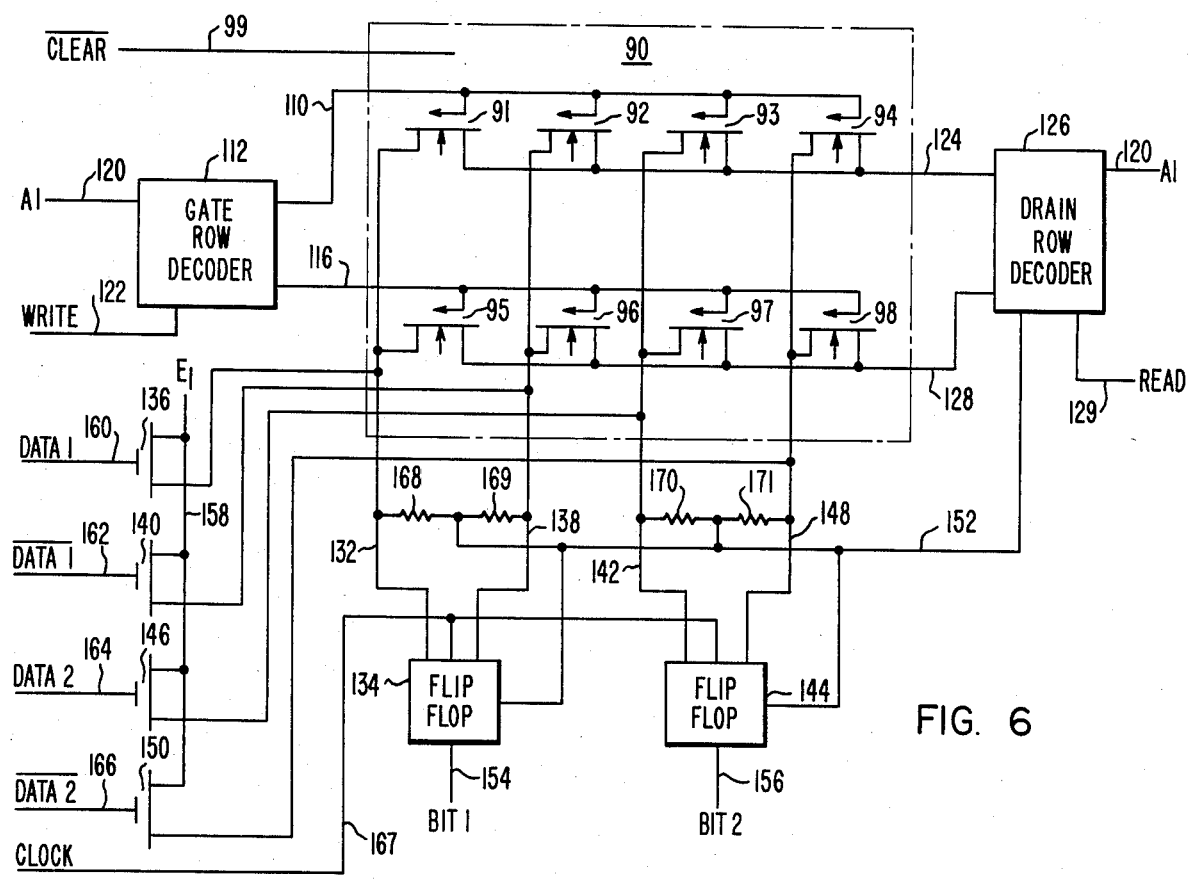
FIG. 6 shows a second embodiment of the invention.

FIG. 2A shows one structure of an N-channel variable threshold transistor that may be utilized in FIGS. 5 and 6. Transistor 18 has a P-doped semiconductor substrate 20 which may be, for example, silicon doped with boron. Within semiconductor substrate 20 is a first N-doped region 22 and a second N-doped region 24. The N-doped regions may be formed by diffusing phosphorus into the semiconductor substrate 20. N-doped region 22 may be coupled to line 26 and function as a source of transistor 18. N-doped region 24 may be coupled to line 28 and function as the drain of transistor 18. An insulation layer 30 is located over semiconductor substrate 20 overlaying a path from N-doped region 22 to N-doped region 24. Insulation layer 30 may be, for example, a first layer of silicon oxide 32 and a second layer of silicon nitride 34. A conductive layer 36 is located on top of insulation layer 30 overlaying a path from N-doped region 22 to at least a predetermined distance from N-doped region 24. The predetermined distance is indicated in FIG. 2 by the distance designated X from N-doped region 24 parallel to the surface of semiconductor substrate 20. Conductive layer 36 may extend over insulation layer 30 from N-doped region 22 to a point over N-doped region 24 as conductive layer 36' which is the usual practice to form the gate of a transistor as shown in FIG. 2B. Conductive layers 36 and 36' function as the gate of transistor 18 and is coupled to line 38.

The insulation layer 30 between semiconductor substrate 20 and conductive layer 36 is adjusted in thickness to exhibit a variable threshold characteristic in the semiconductor substrate 20 extending from N-doped region 22 to a predetermined distance from N-doped region 24. Insulation layer 30 may, for example, include a silicon oxide layer 32 having a thickness t1 of 20 Angstroms and a silicon nitride layer 34 having a thickness t3 of several hundred Angstroms. As shown in FIGS. 2A amd 2B in the region where no variable threshold characteristic is desired thickness t2 of the silicon oxide layer 32 is, for example, 400 Angstroms while the thickness of the silicon nitride layer may be uniform throughout with a thickness t3 of several hundred Angstroms. The thin silicon dioxide layer 32 of thickness t1 is capable of holding positive charge when a voltage potential is placed across the gate and N-doped region 22. Charge from N-doped region 22 and substrate 20 will tunnel into silicon oxide 32 in the region where the oxide is thin as shown in FIGS. 2A and 2B. The positive charge in the oxide layer 32 causes electrons to be attracted to the area below the positive charge in semiconductor substrate 20. When the number of electrons exceeds the number of holes in the P-doped semiconductor region, the region is inverted and has a characteristic of an N-type region or N-channel.

FIG. 2B shows an alternate structure of an N-channel variable threshold transistor that may be utilized in FIGS. 5 and 6. In FIG. 2B, like references are used for functions corresponding to apparatus of FIG. 2A. In FIG. 2B, conductive layer 36' may cover the entire gate region between N-doped regions 22 and 24 of transistor 18'. By covering the thick oxide layer 32 of thickness t2 in the drain area 24, field enhancement of the drain junction is obtained improving the read mechanism, the formation of N-channel region 48. It is noted that for purposes of illustration of view, FIGS. 2A and 2B are not in precise proportion.

Figure 3:
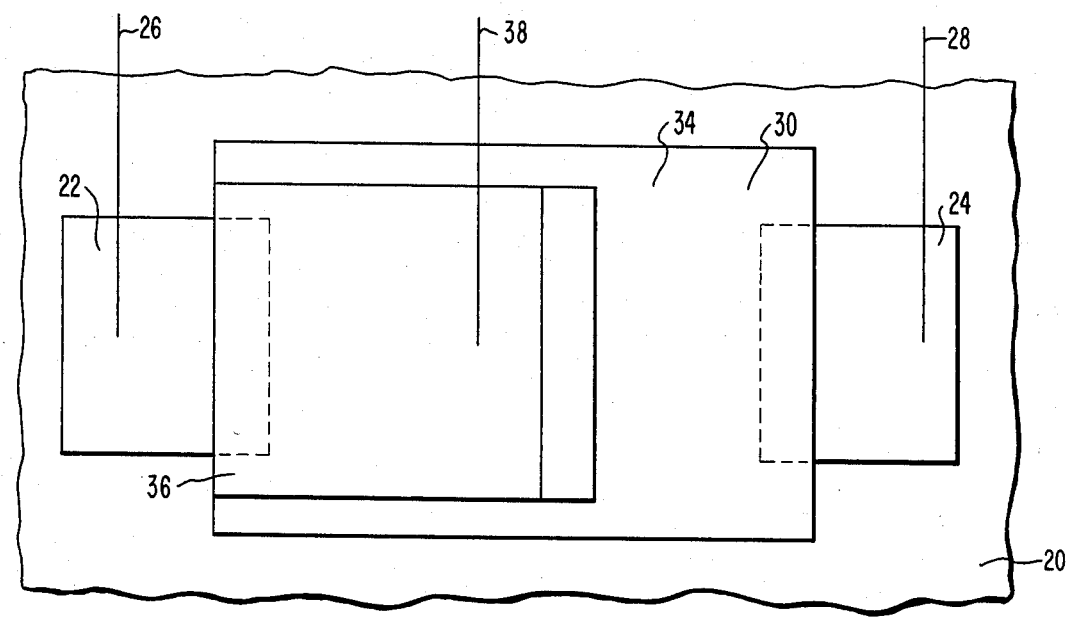
FIG. 3 shows a top view of transistor 18 in FIG. 2A.

A top view of transistor 18 which appears in FIG. 2A is shown in FIG. 3.

Figure 4:
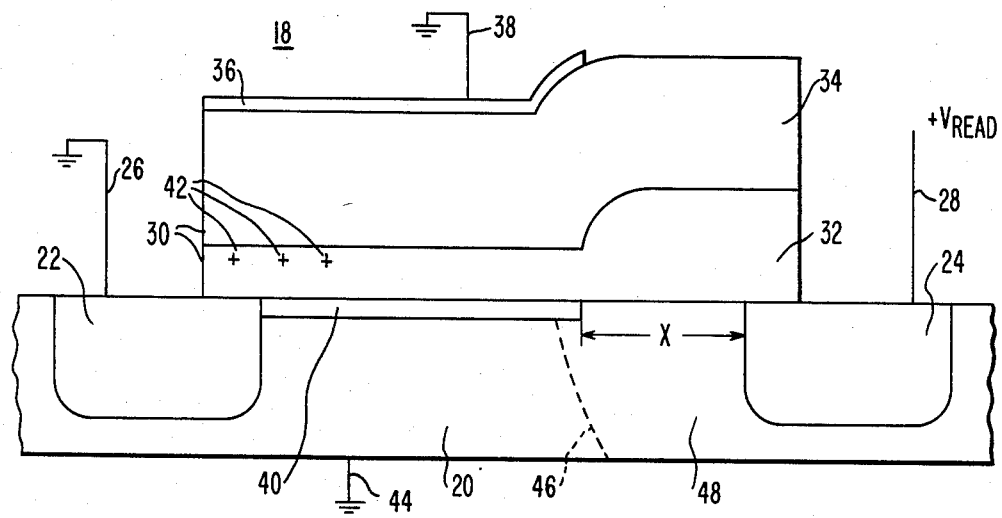
FIG. 4 shows transistor 18 of FIG. 2A with an N type depletion channel below the thin oxide.

FIG. 4 shows transistor 18 of FIG. 2A with an N type depletion channel 40 below the region of thin silicon oxide layer 32.

Positive charge 42 shown in silicon oxide layer 32 had previously tunneled into the silicon oxide layer 32 from semiconductor substrate 20 by voltage between the gate and source of transistor 18, lines 38 and 26. As shown in FIG. 4, lines 38 and 26 are at ground potential. Substrate 20 is coupled over line 44 to ground potential. The N-channel 40 extends from N-doped region 22 to a predetermined distance from N-doped region 24. The predetermined distance is determined by the extent of the thin oxide layer 32 which stops at a distance of X from N-doped region 24.

As shown in FIG. 4, line 28 has a potential of $+V_{READ}$ voltage. The positive voltage on N-doped region 24 causes electrons to be attracted in semiconductor substrate 20 towards the N-doped region 24, causing the area immediately around region 24 and extending out to dotted line 46 to have an N-channel characteristic. Dotted line 46 delineates a depletion region between the N-channel region 48 and the P-type region of semiconductor substrate 20. Of course, the N-channel region 48 reverts back to a P-type region when the voltage on line 28 is reduced. The interaction of N-channel 40 and N-channel region 48 causes a conductive path to be formed between N-doped region 22 through channel 40 through region 48 to N-doped region 24.

The potential of the voltage $V_{READ}$ on line 28 can be adjusted to cause the N-channel region 48 to extend past a predetermined distance from N-doped region 24. If the N-channel region 48 extends beyond the predetermined distance X then the N-channel region 48 will intersect with N-type channel 40 if N-channel 40 is present which depends upon the existence of positive charge 42 in oxide layer 32. If N-channel 40 is non-existent, then there will be no path between N-doped region 22 to N-doped region 24 and no current will pass through or only a negligible amount of current will pass. The presence of N-channel 40 determines one memory state of transistor 18 while the non-existence of N-channel 40 determines the other memory state of transistor 18. The information state in transistor 18 is read by placing a positive potential on N-doped region 24 causing N-channel region 48 to extend a predetermined distance X from N-doped region 24 to intersect with an N-channel if N-channel 40 is present. Transistor 18 is therefore sensed by determining whether there is or is not conduction between N-doped regions 22 and 24 when a positive charge sufficient to cause an N-channel region 48 to extend a predetermined distance from N-doped region 24.

FIG. 5 shows an array 50 of electrically alterable non-volatile memory elements 52 through 60. In FIG. 5 the memory elements 52 through 60 are shown as N-channel transistors each having a gate, drain and source electrode. The body of each transistor 52 through 60 is coupled to the semiconductor substrate of memory array 50 and signal $\overline{CLEAR}$ on line 61. As shown in FIG. 5, memory elements 52 through 60 are arranged into three rows and three columns. The gate electrode of transistors 52, 55 and 58 of row 1 are coupled over line 62 to an output of gate row decoder 64. The gate electrode of transistors 53, 56 and 59 of row 2 are coupled over line 66 to an output of gate row decoder 64. The gate electrode of transistors 54, 57 and 60 of row 3 are coupled over line 68 to an output of gate row decoder 64. Gate row decoder 64 has address signals A1 and A2 coupled over lines 69 and 70, respectively, to its input. Signal write is coupled over line 65 to a control input of gate row decoder 64. Gate row decoder 64 functions to decode the address signals on lines 69 and 70 to select one of the three rows in memory array 50 in response to signal WRITE on line 65. The drain electrode of transistors 52, 55 and 58 are coupled over line 71 to an output of drain row decoder 72. The drain electrode of transistors 53, 56 and 59 are coupled over line 73 to an output of drain row decoder 72. The drain electrode of transistors 54, 57 and 60 are coupled over line 74 to an output of drain row decoder 72. Address signals A1 and A2 are coupled over lines 69 and 70 to an input of drain row decoder 72. Signal READ is coupled over line 75 to a control input of drain row decoder 72. Drain row decoder 72 functions to select one of the row lines 71, 73 or 74 in response to the address signals on lines 69 and 70 and signal READ on line 75.

The source electrode of transistors 52, 53 and 54 in column 1 are coupled over line 76 to one side of resistor 77, the source electrode of transistor 78. Line 76 functions as an output of memory array 50 during read operation as bit 1. The source electrode of transistors 55, 56 and 57 are coupled over line 79 to one side of resistor 80 and to the source electrode of transistor 81. Line 79 functions as an output during read operation of memory array 50 as bit 2. The source electrode of transistors 58, 59 and 60 are coupled over line 82 to one side of resistor 83 and to the source electrode of transistor 84. Line 82 functions as a data output line during read operation of memory array 50 as bit 3. The other side of resistors 77, 80 and 83 are coupled over line 85 as a return path to drain row decoder 72. The drain electrode of transistors 78, 81 and 84 are coupled over line 86 to a voltage potential $E_1$. The gate electrode of transistor 78 is coupled over line 87 to write data 1 signal. The gate electrode of transistor 81 is coupled over line 88 to signal write data 2. The gate electrode of transistor 84 is coupled over line 89 to signal write data 3.

At least one of the non-volatile memory elements 52 through 60 of memory array 50 corresponds to the transistor structure shown in FIGS. 2 and 3 insofar as an N-channel is formed in semiconductor substrate 20 from N-doped region 22 up to a predetermined distance from N-doped region 24 in response to a thin oxide layer above forming part of insulation 30. The gate formed by conductive layer 36 may extend over only the thin portion causing the variable threshold characteristic or over the entire region between the two N-doped regions in a normal gate structure.

FIG. 6 shows a second embodiment of the invention. Memory array 90 comprises a plurality of electrically alterable non-volatile memory elements where each memory cell comprises at least two memory elements for storing information. Normally, one memory element is written in one direction or memory state while the other is written in the other direction or memory state. The memory elements in memory array 90 are arranged in rows and columns. As shown in FIG. 6, the memory elements in memory array 90 are variable threshold transistors. At least one memory cell of memory array 90 is comprised of variable threshold transistors of the type shown in FIGS. 2 and 3. Transistors 91 through 94 are in row one with transistors 91 and 92 forming a first memory cell and transistors 93 and 94 forming a second memory cell. Transistors 95 through 98 are in row 2 with transistors 95 and 96 forming a third memory cell and transistors 97 and 98 forming a fourth memory cell. Memory cells 1 and 3 are in the first column of memory array 90 and memory cells 2 and 4 are in the second column.

Transistors 91 through 98 each have a gate, source and drain electrode. The body of each transistor is coupled to the semiconductor substrate of memory array 90 and signal $\overline{CLEAR}$ on line 99. The gate electrode of transistors 91 through 94 are coupled over line 110 to an output of gate row decoder 112. The gate electrode of transistors 95 through 98 are coupled over line 116 to an output of gate row decoder 112. Signal A1 representing the row address is coupled over line 120 to an input of gate row decoder 112. Signal write is coupled over line 122 to an input of gate row decoder 112. Gate row decoder 112 functions to select either line 110 or 116 in response to the address on line 120.

The drain electrode of transistors 91 through 94 are coupled over line 124 to an output of drain row decoder 126. The drain electrode of transistors 95 through 98 are coupled over line 128 to an output of drain row decoder 126. Address signal A1 is coupled over line 120 to an input of drain row decoder 126. Signal read is coupled over line 129 to an input of drain row decoder 126. Drain row decoder 126 functions to select either line 124 or 128 in response to the address signal on line 120 during read operation to read the information from memory array 90.

The source electrode of transistors 91 and 95 is coupled over line 132 to an input of flip-flop 134, one side of resistor 168 and to the source electrode of transistor 136. The source electrode of transistors 92 and 96 are coupled over line 138 to an input of flip-flop 134, one side of resistor 169 and to the source electrode of transistor 140. The source electrode of transistors 93 and 97 are coupled over line 142 to an input of flip-flop 144, one side of resistor 170 and to the source electrode of transistor 146. The source electrode of transistors 94 and 98 are coupled over line 148 to an input of flip-flop 144, one side of resistor 171 and to the source electrode of transistor 150. Flip-flops 134 and 144 and one side of resistors 168 through 171 have a current return over line 152 to drain row decoder 126. Signal clock is coupled over line 167 to a control input on flip-flops 134 and 144. Flip-flop 134 has an output on line 154 and flip-flop 144 has an output on line 156. Line 154 represents bit 1 of memory array 90 during readout and line 156 represents bit 2 of memory array 90.

The drain electrode of transistors 136, 140, 146 and 150 are coupled over line 158 to a voltage potential $E_1$. The gate electrode of transistor 136 is coupled over line 160 to signal data 1. The gate electrode of transistor 140 is coupled over line 162 to signal $\overline{\text{data 1}}$. The gate electrode of transistor 146 is coupled over line 164 to signal data 2. The gate electrode of transistor 150 is coupled over line 166 to signal $\overline{\text{data 2}}$. The signals on lines 160 and 162 function to provide the true and complement data to be written in memory array 90. The signals on lines 164 and 166 function to provide the true and complement data to be written into column 2 of memory array 90. Flip-flops 134 and 144 function to read columns 1 and 2 of memory array 90.

Figure 7:
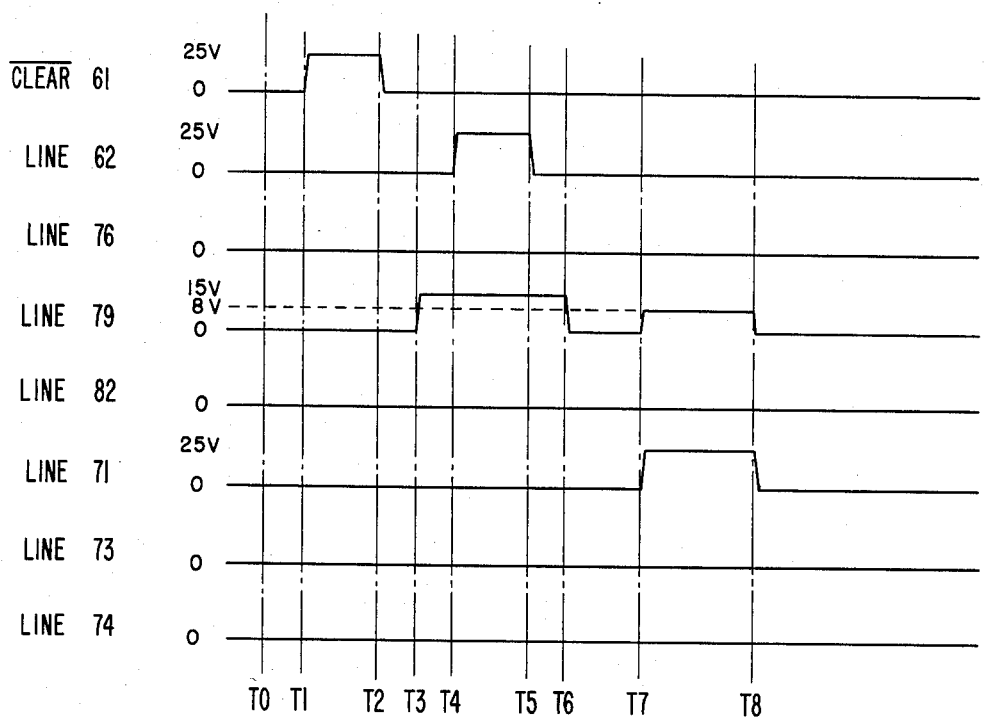
FIG. 7 shows circuit wave forms for typical operation of the embodiment of FIG. 5.

FIG. 7 shows circuit wave forms for the operation of the memory in FIG. 5. In FIG. 7 the ordinate represents voltage and the abscissa represents time. Referring now to FIGS. 5 and 7 at T0, lines 61, 62, 66, 68, 76, 79, 82, 71, 73 and 74 are at ground potential. At T1 signal $\overline{\text{CLEAR}}$ on line 61 goes from ground potential to a positive potential such as 25 volts which causes the body of the transistors in memory array 50 to be at +25 volts while the gate electrodes are at 0 volts. The +25 volts across the insulation of transistors 52 through 60 causes positive charge to tunnel into the insulation layer 30 and in particular silicon oxide layer 32. Sufficient charge is stored in insulation layer 30 to cause the transistors to be in the depletion mode for a portion of the hysteresis window (see FIG. 1) causing an N-channel to form in substrate 20 underneath the positive charge. It is understood that the substrate of memory array 50 is in an isolation tub isolated from the other circuitry in FIG. 5. At time T2 signal $\overline{\text{CLEAR}}$ on line 61 goes from +25 volts to 0 volts bringing the semiconductor substrate of the transistors is memory array 50 to ground potential. It is understood that signal $\overline{\text{CLEAR}}$ on line 61 clears all the transistors in memory array 50 since $\overline{\text{CLEAR}}$ is coupled to the body of each transistor. Clearing all the transistors in a memory array to one threshold voltage is commonly called a block clear. It is understood that individual rows could be cleared to a particular threshold voltage by brining $\overline{\text{CLEAR}}$ bar signal to only the body of the transistors in a particular row. This may be accomplished by having individual diffusion regions for each row so that the semiconductor substrate of a particular row may be isolated from the other rows of transistors in memory array 50. Individual writing of rows would then require a $\overline{\text{CLEAR}}$ row decoder for selecting a particular row when clearing is desired.

Now that all transistors in memory array 50 have been cleared to a particular threshold state causing a channel to form underneath each thin oxide region of each transistor, information may be written into each row by merely writing or altering the threshold voltage of the transistors desired to be in the other state. At time T3 lines 76 and 82 remain at ground. Line 79 is pulled from 0 volts to +15 volts. Line 79 is pulled to 15 volts by the conduction of transistor 81 which is turned on by write data 2 on line 88. Transistor 81 couples voltage supply $E_1$ on line 86 to line 79. At time T4 the voltage on line 62 goes from 0 volts to +25 volts causing a +25 volts voltage across the insulation of transistors 52 and 58. Line 62 or row 1 of memory array 50 was selected by gate row decoder 64 in accordance with the address signals A1 and A2 on lines 69 and 70. Since line 79 is at +15 volts the source and channel of transistor 55 are at +15 volts. The insulation layer between the gate and body of transistor 55 therefore only has a potential of +10 volts across it which is insufficient to cause a change in threshold voltage of transistor 55. Meanwhile, transistors 52 and 58 are written to the other threshold state or into the enhancement mode due to the +25 volts between the gate and body. Transistors 52 and 58 will therefore no longer have an N-channel in the substrate underneath the thin oxide portion of the transistors. At time T5 the voltage on line 62 goes from +25 volts to 0 volts. At time T6 the voltage on line 79 goes from +15 volts to 0 volts. T6 marks the end of the write cycle for writing information into a particular row, row 1, of the transistors in memory array 50.

To read the information from row 1 in memory array 50 line 71 goes from 0 volts to +25 volts at time T7. Line 71 was selected in response to the address signals A1 and A2 on line 69 and line 70 by drain row decoder 72. The voltage on line 71 raises the drain electrode of transistors 52, 55 and 58 to +25 volts causing a depletion region to form in the substrate around the drain of transistors 52, 55 and 58. Since no channel exists in transistors 52 and 58 since they have been written into the enhancement mode region, no current will flow through transistors 52 and 58 and bit 1 on line 76 and bit 3 on line 82 will remain at ground potential or the potential of line 85 which normally would be at ground. The depletion region around the drain of transistor 55 would extend a predetermined distance so as to intersect with the channel underneath the thin oxide region of transistor 55 which would cause transistor 55 to conduct between the drain and source electrodes. The conduction would cause a current from line 71 through line 79 and resistor 80 to line 85 causing a voltage to appear across resistor 80 on line 79 at the output on bit 2. The voltage across resistor 80 may be 8 volts, for example. If the voltage on line 71 is held at +25 volts, current will continually flow through transistor 55. If, however, the voltage on line 71 is allowed to discharge due to the flow of current through transistor 55, the voltage on line 71 will discharge until the pinch-off voltage region is reached in transistor 55 at which time no more current would flow through transistor 55. At time T8 the voltage on line 71 goes from +25 volts to 0 volts and the voltage on line 79 goes from +8 volts to 0 volts which complete the read cycle of row 1 of the transistors in memory array 50.

Figure 8:
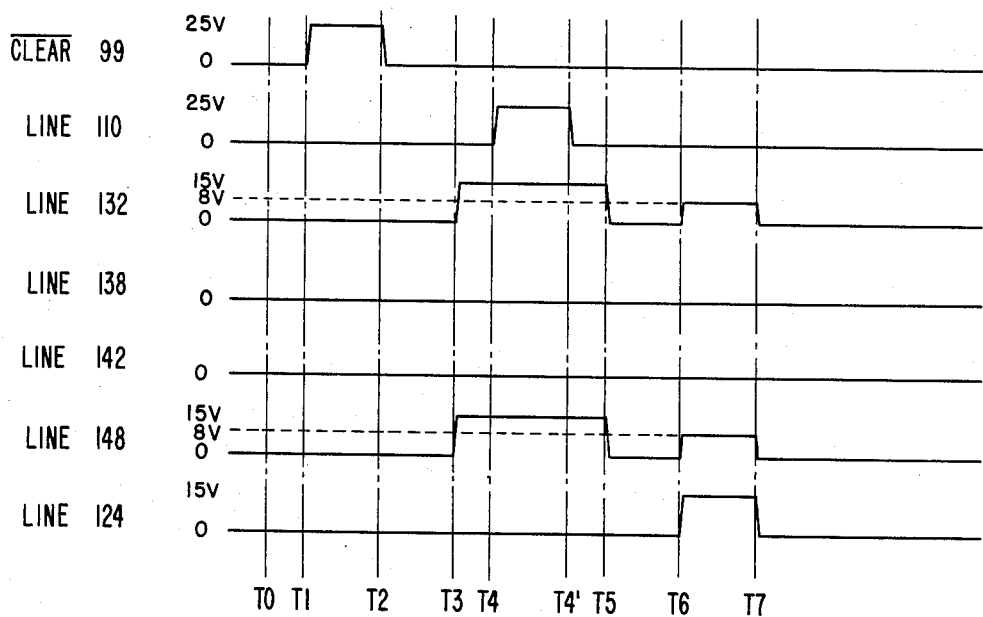
FIG. 8 shows circuit wave forms for typical operation of the embodiment in FIG. 6.

FIG. 8 shows circuit wave forms for the operation of the memory shown in FIG. 6. In FIG. 8 the ordinate represents voltage and the abscissa represents time. At time T0 lines 99, 114, 110, 132, 138, 142, 148 and 124 are at ground potential as shown in FIG. 8. At time T1 signal $\overline{\text{CLEAR}}$ on line 99 goes from 0 volts to 25 volts raising the potential of the body of transistors 91 through 98 to +25 volts while the gate electrodes are held at 0 volts. The 25 volt polarization potential across the insulation layer 30 (see FIG. 2) causes the variable threshold transistors 91 through 98 to be in the depletion mode with an N-channel forming in the substrate below the thin insulation layer where positive charge is stored. It is understood that the N-channel extends from the source electrode to a predetermined distance from the drain electrode. The action of signal $\overline{\text{CLEAR}}$ might be termed a block clear since all the bodies of the transistors in each row are commonly connected. It is understood that the transistors in memory array 90 are isolated from the rest of the circuitry shown in FIG. 6. This may be accomplished by providing a separate isolation diffusion for memory array 90. Since all the transistors in memory array 90 have been cleared to the depletion mode data may be written into the memory array by writing the selected transistors to the enhancement mode condition. Since two transistors are used per memory cell in memory array 90, one transistor in each memory cell per row would be written to the enhancement mode. The other transistor would remain in the depletion mode. At time T3 lines 132 and 148 go from 0 volts to +15 volts caused by the conduction of transistors 136 and 150 which couples voltage supply $E_1$ to lines 132 and 148. Transistors 136 and 150 are controlled by signals data 1 on line 160 and data $\overline{2}$ on line 166 respectively. The source electrode of transistors 91 and 94 are raised to +15 volts and the N-channel of transistors 91 and 94 is likewise raised to +15 volts. At tme T4 the voltage on line 110 goes from 0 volts to +25 volts. Since the source electrode of transistors 91 and 94 are at +15 volts a polarization voltage of only 10 volts appears across the insulation layer of transistors 91 and 94. The source electrode of transistors 92 and 93 are at 0 volts causing a +25 volt polarization voltage across the insulation layer of transistors 92 and 93 causing transistors 92 and 93 to be shifted to the enhancement mode with the N-channel being removed. At time T4 the voltage on line 110 goes from 25 volts to 0 volts. At time T5 the voltage on lines 132 and 148 go from +15 volts to 0 volts. Row 1 of memory array 90 has now been written with information where the information is determined by comparing the status or polarization of the two transistors per memory cell.

To read the information in row 1 of memory array 90 line 124 goes from 0 volts to +25 volts at T6. The drain electrode of transistors 91 through 94 is raised to the voltage of +25 volts and a depletion region forms around the drain extending a predetermined distance from the drain into the body of transistors 91 through 24. The depletion region around the drain intersects with the N-channel in transistors 91 and 94 causing transistors 91 and 94 to be conductive while transistors 92 and 93 are non-conductive since no N-channel exists. Lines 132 and 148 are pulled positive to, for example, +8 volts at T6 due to the conduction of transistors 91 and 94. Lines 138 and 142 remain at ground potential due to the non-conduction of transistors 92 and 93. The data of memory cell 1 consisting of transistors 91 and 92 may be read out by comparing the polarity of the voltage on lines 132 and 138. The memory state of memory cell 2 consisting of transistors 93 and 94 may be read by comparing the polarity of the voltage on lines 142 and 148. As shown in FIG. 6, flip-flop 134 is coupled to lines 132 and 138 for sensing the polarity of the voltage upon a clock signal on line 167. Flip-flop 144 functions to sense the polarity of the voltage on lines 142 and 148 upon a clock signal on line 167. The output of flip-flops 134 and 148 is on lines 154 and 156 respectively and represents the readout of memory cell 1 or bit 1 and memory cell 2 or bit 2. At time T7 the voltage on line 124 goes from +25 volts to 0 volts. The voltage on lines 132 and 148 go from +8 volts to 0 volts.

The invention provides an electrically alterable non-volatile memory for storing information comprising an array of electrically alterable non-volatile memory elements, means for writing information into the array, means for reading information from the array, at least one of the non-volatile memory elements including a P-doped semiconductor substrate having first and second N-doped regions spaced apart, an insulation layer over the substrate overlaying a path from the first N-doped region to the second N-doped region, a conductive layer on top of the insulation layer overlaying a path from the first N-doped region to at least a predetermined distance from the second N-doped region, the insulation layer between the substrate and the conductive layer having a thickness to exhibit a variable threshold characteristic upon application of a polarization voltage to cause at selected times a depletion mode channel to form in the substrate extending from the first N-doped region to a predetermined distance from the second N-doped region to enable conduction between the first and second N-doped regions at times when the depletion mode channel in the substrate intersects with a depletion region extending from the second N-doped region caused by a predetermined potential of the second N-doped region.

The invention further provides an electrically alterable non-volatile memory element for storing information comprising a P-doped semiconductor substrate having first and second N-doped regions spaced apart, an insulation layer over the substrate overlaying a path from the first N-doped region to the second N-doped region, a conductive layer on top of said insulation layer overlaying a path from the first N-doped region to at least a predetermined distance from the second N-doped region, the insulation layer between the substrate and the conductive layer having a thickness to exhibit a variable threshold characteristic upon application of a polarization voltage to cause at selected times a depletion mode channel to form in the substrate extending from the first N-doped region to a predetermined distance from the second N-doped region to enable conduction between the first and second N-doped regions at times when the depletion mode channel in the substrate intersects with a depletion region extending from said second N-doped region caused by a predetermined potential of said second N-doped region.

I claim:

1. An electrically alterable non-volatile memory for storing information comprising:
   an array of electrically alterable non-volatile memory elements arranged in a plurality of rows and a plurality of columns,
   each said non-volatile memory element includes a P-doped semiconductor substrate having first and second N-doped regions spaced apart, an insulation layer over said substrate overlaying a path from said first N-doped region to said second N-doped region, a conductive layer on top of said insulation layer overlaying a path from said first N-doped region to at least a predetermined distance from said second N-doped region, said insulation layer between said substrate and said conductive layer having a thickness to exhibit a variable threshold characteristic upon application of a first polarization voltage between said conductive layer and said substrate to cause an N-type depletion mode channel to form in said substrate extending from said first N-doped region to only a predetermined distance from said second N-doped region, means for writing information into said array, means for reading information from said array including, first means for holding the potential of the conductive layer of each memory element in said array at substantially the potential of its respective substrate, second means for selecting one row of said array in response to address signals, third means for holding the potential of said second region of each memory element in said non-selected rows less than a predetermined positive potential with respect to its respective substrate to prevent the formation of a depletion region in each memory element from extending from said second N-doped region to at least said predetermined distance into said substrate, fourth means for applying a first voltage to the second region of each memory element in said selected row, said first voltage more positive than said predetermined positive potential and being of sufficient magnitude to form a depletion region in each memory element extending from said second N-doped region to at least said predetermined distance into said substrate towards said first region to intersect with said depletion mode channel at times said depletion mode channel is present to enable conduction between said first and second N-doped regions, and means for sensing the conduction of current from said second region to said first region of each memory element in said selected row.

2. The electrically alterable non-volatile memory of claim 1 wherein said insulation layer includes a layer of silicon oxide and a layer of silicon nitride.

3. The electrically alterable non-volatile memory of claim 2 wherein said layer of silicon oxide has a first thickness t1 from said first N-doped region to a predetermined distance X from said second N-doped region and a second thickness t2 greater than said thickness t1 extending from said second N-doped region out said distance X to intersect with said layer of silicon oxide of thickness t1.

4. The electrically alterable non-volatile memory of claim 2 wherein said layer of nitride has a thickness t3.

5. The electrically alterable non-volatile memory of claim 1 wherein said conductive layer overlays a path from said first N-doped region to said second N-doped region.

6. The electrical alterable non-volatile memory of claim 1 wherein said conductive layer overlays a path from said first N-doped region to only a predetermined distance X from said second N-doped region.

7. The electrically alterable non-volatile memory of claim 1 wherein said substrate of each memory element is a common substrate to each other.

8. The electrically alterable non-volatile memory of claim 1 wherein said means for writing includes:

fifth means for holding the potential of the conductive layer of each memory element in said array at substantially the potential of ground, sixth means for applying a positive voltage to the substrate of every memory element in said array to cause said N-type depletion mode channel to form in said substrate extending from said first N-doped region to only a predetermined distance from said second N-doped region, seventh means for selecting one row of said array in response to address signals and to a write control signal, said conductive layer in each memory element of each row of said array connected in common and coupled to said seventh means for selecting, said first region in each memory element of each column of said array connected in common, eighth means for applying a positive voltage to said first regions of each column in response to a first state of binary data desired to be stored, ninth means for applying substantially ground potential to said first regions of each column in response to a second state of binary data desired to be stored, said seventh means for selecting including tenth means for applying a positive voltage to said conductive layer in each memory element of said selected row to remove the previously formed depletion mode channel on those memory elements where its first region is at substantially ground potential.

9. The electrically alterable non-volatile memory of claim 1 wherein said means for writing includes:

fifth means for holding the potential of the conductive layer of each memory element in said array at substantially ground potential, sixth means for selecting one row of said array in response to address signals and to a write control signal, seventh means for applying a positive voltage to the substrate of every memory element in said selected row to cause said N-type depletion mode channel to form in said substrate extending from said first N-doped region to only a predetermined distance from said second N-doped region, said conductive layer in each memory element of each row of said array connected in common and coupled to said sixth means for selecting, said first region in each memory element of each column of said array connected in common, eighth means for applying a positive voltage to said first regions of each column in response to a first state of binary data desired to be stored, ninth means for applying substantially ground potential to said first regions of each column in response to a second state of binary data desired to be stored, said sixth means for selecting including tenth means for applying a positive voltage to said conductive layer in each memory element of said selected row to remove the previously formed depletion mode channel on those memory elements where its first region is at substantially ground potential.

10. The electrically alterable non-volatile memory of claim 1 wherein said second region in each memory element of each row of said array are connected in common and coupled to said second means for selecting.

11. The electrically alterable non-volatile memory of claim 10 wherein said second means for selecting, third means for holding and fourth means for applying include a drain row decoder responsive to said address signals and a read control signal.

12. The electrically alterable non-volatile memory of claim 10 wherein said conductive layer in each memory element of each row of said array are connected in common and coupled to said first means for holding.

13. The electrically alterable non-volatile memory of claim 12 wherein said first region in each memory element of each column of said array are connected in common and coupled to said means for sensing.

14. The electrically alterable non-volatile memory of claim 12 wherein said first means for holding includes a gate row decoder responsive to a write control signal.

15. An electrically alterable non-volatile memory for storing information comprising:
a plurality of memory cells arranged in a plurality of rows and a plurality of columns;
each said memory cell includes a plurality of variable threshold transistors;
each of said variable threshold transistors including
a P-doped semiconductor substrate having first and second N-doped regions spaced apart, an insulation layer over said substrate overlaying a path from said first N-doped region to said second N-doped region, a conductive layer on top of said insulation layer overlaying a path from said first N-doped region to at least a predetermined distance from said second N-doped region, said insulation layer between said substrate and said conductive layer having a thickness to exhibit a variable threshold characteristic upon application of a first polarization voltage between said conductive layer and said substrate to cause an N-type depletion mode channel to form in said substrate extending from said first N-doped region to only a predetermined distance from said second N-doped region,
means for writing information into said memory cells,
means for reading information from said memory cells including,
first means for holding the potential of the conductive layer of each variable threshold transistor at substantially the potential of its respective substrate,
second means for selecting one row of memory cells in response to address signals,
third means for holding the potential of said second region of each variable threshold transistor in said non-selected rows less than a predetermined positive potential with respect to its substrate to prevent the formation of a depletion region in each variable threshold transistor from extending from said second N-doped region to at least said predetermined distance into said substrate,
fourth means for applying a first voltage to the second region of each variable threshold transistor in said selected row, said first voltage more positive than said predetermined positive potential and being of sufficient magnitude to form a depletion region in each variable threshold transistor extending from said second N-doped region to at least said predetermined distance into said substrate towards said first region to intersect with said depletion mode channel at times said depletion mode channel is present to enable conduction between said first and second N-doped regions, and
means for sensing the conduction of current from said second region to said first region of at least two variable threshold transistors of each memory cell in said row.

16. The electrically alterable non-volatile memory of claim 15 wherein said insulation layer includes a layer of silicon oxide and a layer of silicon nitride.

17. The electrically alterable non-volatile memory of claim 16 wherein said layer of silicon oxide has a first thickness t1 from said first N-doped region to a predetermined distance X from said second N-doped region and a second thickness t2 greater than said thickness t1 extending from said second N-doped region out said distance X to intersect with said layer of silicon oxide of thickness t1.

18. The electrically alterable non-volatile memory of claim 16 wherein said layer of nitride has a thickness of t3.

19. The electrically alterable non-volatile memory of claim 15 wherein said conductive layer overlays a path from said first N-doped region to said second N-doped region.

20. The electrical alterable non-volatile memory of claim 15 wherein said conductive layer overlays a path from said first N-doped region to only a predetermined distance X from said second N-doped region.

21. The electrically alterable non-volatile memory of claim 15 wherein said substrate of each variable threshold transistor of each memory cell is a common substrate to each other.

22. The electrically alterable non-volatile memory of claim 15, wherein said second region of each variable threshold transistor in each memory cell of each row are coupled together.

23. The electrically alterable non-volatile memory of claim 22 wherein said conductive layer of each variable threshold transistor in each memory cell of each row are coupled together.

24. The electrically alterable non-volatile memory of claim 23 wherein said first region of one variable threshold transistor in each memory cell of each column are coupled together.

25. The electrically alterable non-volatile memory of claim 24 wherein said first region of a second variable threshold transistor in each memory cell of each column are coupled together.

26. A method for storing and recovering information from an array of electronically alterable non-volatile memory elements arranged in a plurality of rows and a plurality of columns, wherein each non-volatile memory element comprises a P-doped semiconductor substrate having first and second N-doped regions spaced apart, an insulation layer over said substrate overlaying a path from said first N-doped region to said second N-doped region, a conductive layer on top of said insulation layer overlaying a path from said first N-doped region to at least a predetermined distance from said second N-doped region, said insulation layer between said substrate and said conductive layer having a thickness to exhibit a variable threshold characteristic upon application of a first polarization voltage between said conductive layer and said substrate to cause a depletion mode channel to form in said substrate extending from said first N-doped region to only a predetermined distance from said second N-doped region indicative of a first memory state and upon application of a second polarization voltage to cause said depletion mode channel to convert to the P-type semiconductor material of said substrate indicative of a second memory state, said method comprising the steps of:
writing information into said array,
reading information from said array including the steps of,
holding the potential of the conductive layer of each memory element in said array at substantially the potential of its respective substrate,
selecting one row of said array in response to address signals, holding the potential of said second region of each memory element in said non-selected rows less than a predetermined positive potential with respect to its substrate to prevent the formation of a depletion region in each memory element from extending from said second N-doped region to at least said predetermined distance into said substrate, applying a first voltage to the second region of each memory element in said selected row, said first voltage more positive than said predetermined positive potential and being of sufficient magnitude to form a depletion region in each memory element extending from said second N-doped region to at least said predetermined distance into said substrate towards said first region to intersect with said depletion mode channel at times said depletion mode channel is present to enable conduction between said first and second N-doped regions; and sensing the conduction of current from said first region to said second region of each memory element in said selected row.

27. A method for storing and recovering information in from a non-volatile memory element of the type which comprises a P-doped semiconductor substrate having first and second N-doped regions spaced apart, an insulation layer over said substrate overlaying a path from said first N-doped region to said second N-doped region, a conductive layer on top of said insulation layer overlaying a path from said first N-doped region to at least a predetermined distance from said second N-doped region, said insulation layer between said substrate and said conductive layer having a thickness to exhibit a variable threshold characteristic upon application of a first polarization voltage between said conductive layer and said substrate to cause a depletion mode channel to form in said substrate extending from said first N-doped region to only a predetermined distance from said second N-doped region indicative of a first memory state and upon application of a second polarization voltage to cause said depletion mode channel to convert to the P-type semiconductor material of said substrate indicative of a second memory state, said method comprising the steps of:

forming an N-depletion mode channel in said substrate from said first N-doped region to a predetermined distance from said second N-doped region indicative of a first memory state;

sensing said first memory state including the steps of applying a predetermined voltage to said second N-doped region to generate an N-depletion region extending at least said predetermined distance from said second N-doped region to intersect with said depletion mode channel; and detecting conduction of current between said first and second N-doped regions.

* * * * *